United States Patent [19]

Asai et al.

[11] Patent Number: 4,817,025
[45] Date of Patent: Mar. 28, 1989

[54] DIGITAL FILTER

[75] Inventors: Shin Asai, Tenri; Kazumitsu Miyakoshi, Yamatokoriyama; Daisuke Mochisuki, Nara, all of Japan

[73] Assignee: Sharp Kabushiki Kaisha, Osaka, Japan

[21] Appl. No.: 154,466

[22] Filed: Feb. 5, 1988

Related U.S. Application Data

[63] Continuation of Ser. No. 698,008, Feb. 4, 1985, abandoned.

[30] Foreign Application Priority Data

Feb. 3, 1984 [JP] Japan .................. 59-18927
Feb. 3, 1984 [JP] Japan .................. 59-18928

[51] Int. Cl.$^4$ .............................................. G06F 7/38
[52] U.S. Cl. ............................................ 364/724.01
[58] Field of Search .......................................... 364/724

[56] References Cited

U.S. PATENT DOCUMENTS

| | | | |
|---|---|---|---|
| 3,822,404 | 7/1974 | Croisier et al. | 364/724 |
| 3,993,890 | 11/1976 | Peled et al. | 364/724 |
| 4,016,410 | 4/1977 | Eggermont | 364/724 |
| 4,223,389 | 9/1980 | Amada et al. | 364/724 |
| 4,323,980 | 4/1982 | Houdard et al. | 364/724 |
| 4,337,518 | 6/1982 | Ohnishi et al. | 364/724 |
| 4,344,149 | 8/1982 | Van de Meeberg et al. | 364/724 |
| 4,403,245 | 9/1983 | Wischermann | 364/724 |
| 4,484,299 | 11/1984 | Lambourn et al. | 364/724 |
| 4,533,874 | 8/1985 | Fischer | 364/724 |
| 4,550,415 | 10/1985 | De Bus, Jr. et al. | 364/724 |
| 4,615,026 | 9/1986 | Schiff | 364/724 |

Primary Examiner—Gary V. Harkcom
Assistant Examiner—Long T. Nguyen
Attorney, Agent, or Firm—Flehr, Hohbach, Test, Albritton & Herbert

[57] ABSTRACT

A digital filter of linear phase non-cyclic type comprises a shift register composed of serially connected delay elements with a specified delay time. The outputs from the individual delay elements are multiplied and added so that the output sampling frequency is twice that of the input sampling frequency which enters the shift register. The number of multiplications is significantly reduced by making the number of output lines from the delay elements to be odd and by placing adders between the shift register and the device for carrying out multiplications. An alternative method is to use read only memories instead of the means for carrying out multiplications.

7 Claims, 10 Drawing Sheets

DIGITAL FILTER

This is a continuation of application Ser. No. 698,008 filed Feb. 4, 1985, now abandoned.

BACKGROUND OF THE INVENTION

This invention relates to a digital filter and, in particular, to a digital filter of linear phase non-recursive type.

Figure 1:
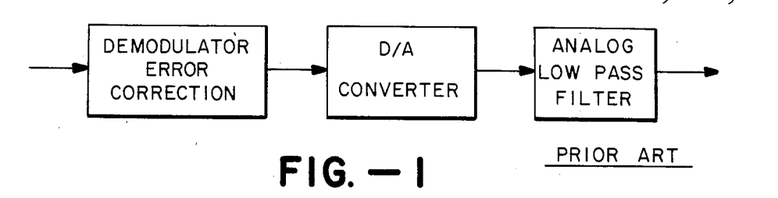
FIG. 1 is a block diagram describing the demodulating system of a digital audio unit.
Figure 2:
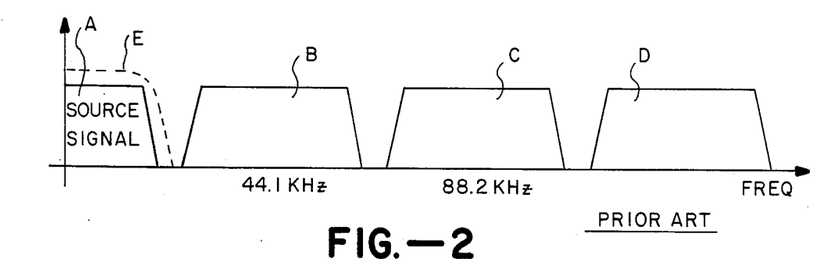
FIG. 2 is a frequency characteristic diagram for showing modulation by this system.

A digital audio system generally makes use of an analog low pass filter in order to remove the high frequency components contained in the output of the digital-analog converter. FIG. 1 shows a circuit block diagram in such a case, a frequency characteristic diagram being shown in FIG. 2. In general, a low pass filter is required with a characteristic shown by the dotted line E so that the source signal A is passed but high frequency components B, C and D are attenuated. It is not a desirable method, however, to make use of a filter with such steep characteristics because distortions will be caused in the high frequency part of the audio signals.

Figure 3:
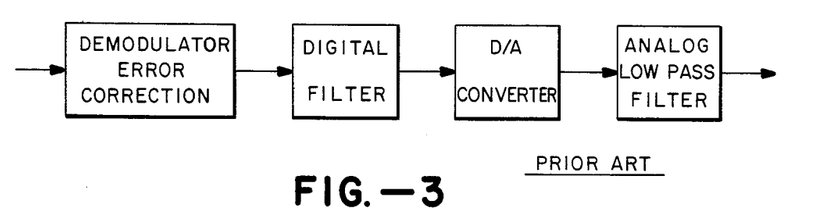
FIG. 3 is a block diagram of the system of FIG. 1 with a digital filter.

For this reason, a digital filter is usually disposed before the digital-analog converter as shown in FIG. 3. If the higher harmonics component B which is closest to the normal playback range can be eliminated or if a digital filter with the characteristics shown by the dotted line F of FIG. 4 can be used, the result will be as shown in FIG. 5, there remaining only higher harmonics C which can be eliminated with an analog low pass filter with a relatively gentle frequency characteristic G. Thus, the distortion of waveforms can be minimized and high fidelity reproduction becomes possible.

Figure 6:
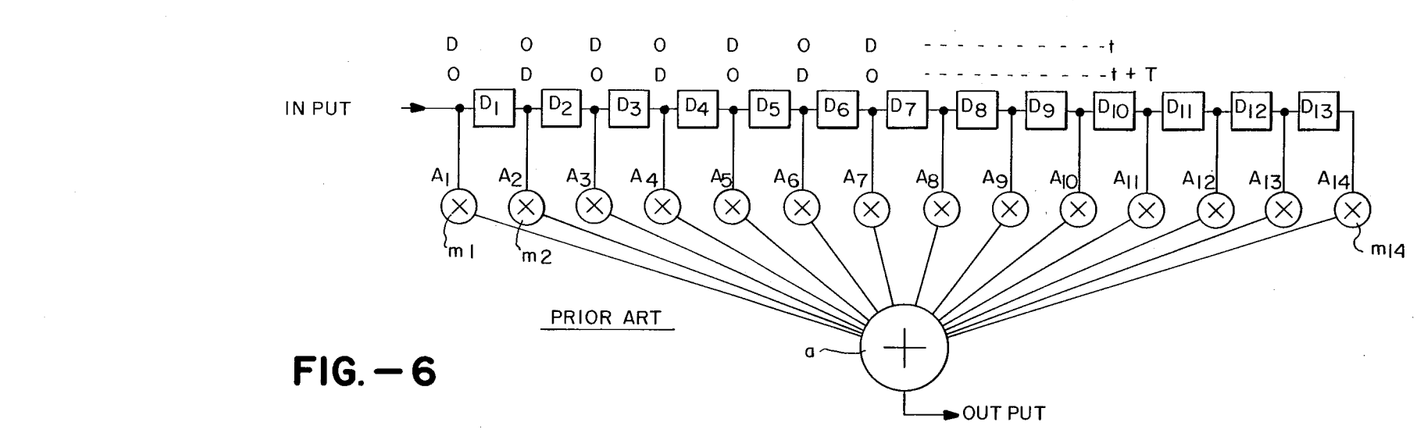
FIGS. 6 and 7 are circuit diagrams of conventional digital filters.

FIG. 6 shows the circuit structure of a conventional digital filter of non-recursive type with its output sampling frequency twice as large as the input sampling frequency. In FIG. 6, delay elements $D_1 \ldots D_{13}$ have a same delay time T, $A_1 \ldots A_{14}$ are coefficients, $m_1 \ldots m_{14}$ are multipliers and a is an adder. If the digital filter is of linear phase type, the following relationships hold among the coefficients: $A_1=A_{14}$, $A_2=A_{13}$, $A_3=A_{12}$, $A_4=A_{11}$, $A_5=A_{10}$, $A_6=A_9$ and $A_7=A_8$.

Figure 4:
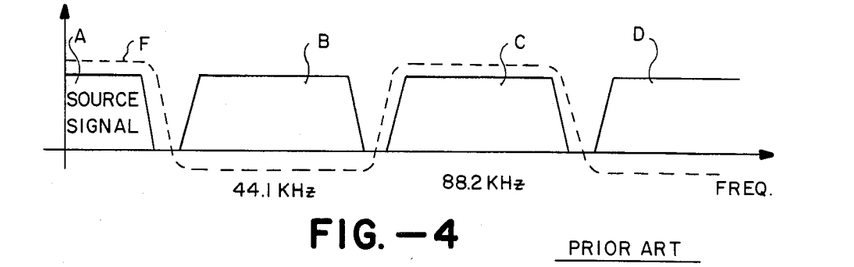
FIGS. 4 and 5 are frequency characteristic diagrams for explaining the modulation of the system of FIG. 3.
Figure 5:
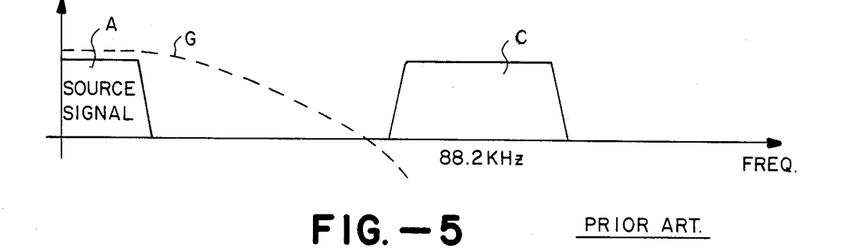

The usual method of making the output sampling frequency of such a digital filter twice that of the input sampling frequency so that its characteristics will be as shown by the dotted line F of FIG. 4 (and that, for example, a band with its center at 44.1 KHz will be attenuated but another band with its center twice that value, or 88.2 KHz, as well as the source signal A will pass) is to insert zero data between the input data of the digital filter once every time period of T. If this method is used, the input data of even-numbered multipliers $m_2, m_4 \ldots m_{14}$ become 0 at certain time t and those of odd-numbered multipliers $m_1, m_3 \ldots m_{13}$ become 0 at time (t+T) as shown in FIG. 6.

Figure 7:
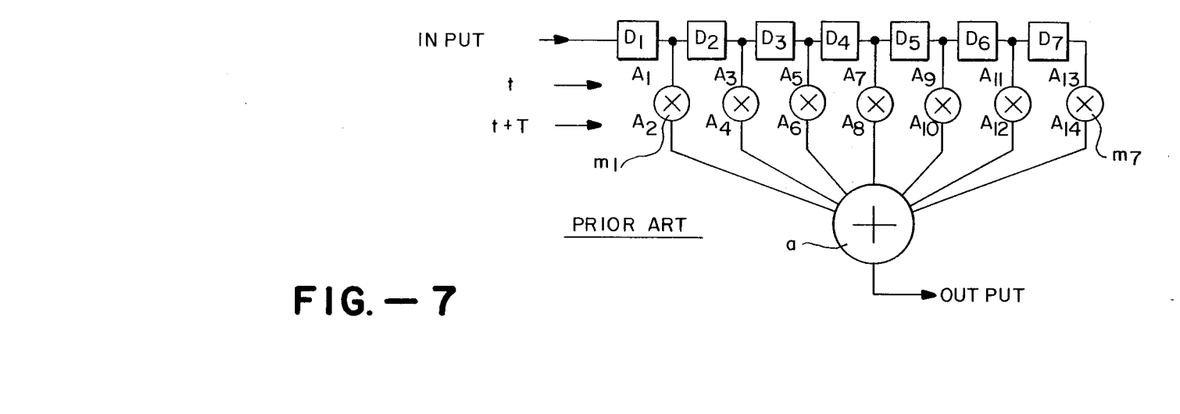

In order to reduce the number of multipliers by a factor of 2, a circuit composition shown in FIG. 7 may now be considered. At time t, the seven multipliers $m_1 \ldots m_7$ respectively execute multiplications of coefficients $A_1, A_3, A_5, A_7, A_9, A_{11}$ and $A_{13}$ with the output data from the delay elements while at time (t+T) they execute multiplications of coefficients $A_2, A_4, A_6, A_8, A_{10}, A_{12}$ and $A_{14}$ with the output data from the delay elements. Thus, by executing multiplications of odd-numbered and even-numbered coefficients alternately, the same output can be obtained as that by using the digital filter of FIG. 6. However, the number of multiplications cannot be reduced any further.

In general, multiplications take more time than additions and subtractions. If the time required for each multiplication is to be reduced, the hardware will become complicated and expensive. For this reason, it is extremely important to reduce the frequency of multiplications in the data processing of a digital audio system.

SUMMARY OF THE INVENTION

It is therefore an object of this invention to provide a method of reducing the frequency of multiplications as much as possible in the operation of a digital filter of a linear phase non-cyclic type.

A digital filter of linear phase non-cyclic type according to one embodiment of the present invention comprises a shift register with a specific number of serially connected delay elements and the outputs from these delay elements are added and multiplied so that the output sampling frequency will be twice the input sampling frequency which characterizes the input to the shift register, but this is achieved according to this embodiment by making the number of output lines of the delay elements from the shift register to be odd and by providing adders before (or at an earlier stage than) the multiplier means for performing multiplications.

According to another embodiment of the present invention, the multiplying means mentioned above is replaced by a read only memory (ROM). Described more specifically, another digital filter according to the present invention comprises a serial-type shift register with a longitudinally connected delay elements, a ROM for which address is selected by the output lines of these delay elements and accumulators for adding outputs from this ROM. The ROM is divided into segments and each segment has associated with it an accumulator which adds the output from the associated ROM segment. The filter output is obtained by adding the outputs from the individual accumulators.

BRIEF DESCRIPTION OF THE DRAWINGS

Embodiments of the present invention are shown in FIGS. 8-19.

DETAILED DESCRIPTION OF THE INVENTION

Figure 8:
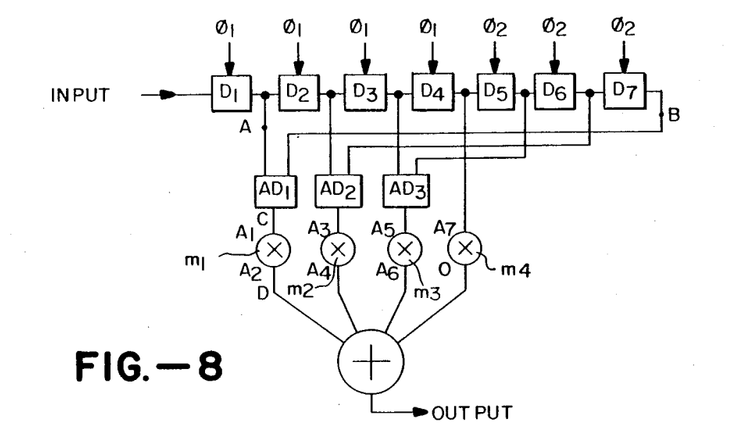
FIG. 8 is a circuit diagram according to a first embodiment.
Figure 9:
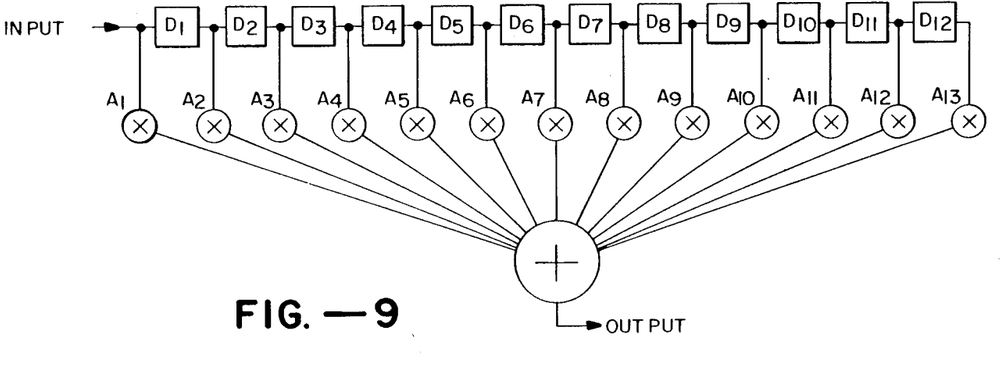
FIGS. 9 and 10 are diagrams presented for explaining the principle of the present invention.
Figure 10:
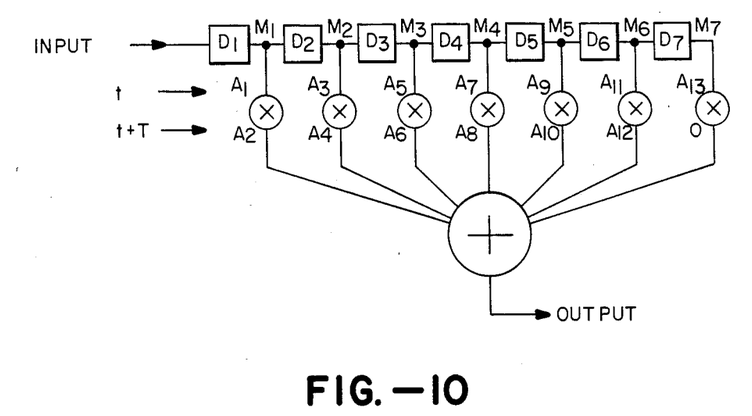

A first embodiment of the present invention is shown in FIG. 8 wherein $D_1 \ldots D_7$ are delay elements, $\phi_1$ and $\phi_2$ are two-phase clock signals, $AD_1 \ldots AD_3$ are first-stage adders, $m_1 \ldots m_4$ are multipliers, $A_1 \ldots A_7$ and O are multiplicative coefficients. Symbol "+" in this and other drawings indicates an adder. In order to explain the operation of this embodiment, FIG. 8 is modified to FIGS. 9 and 10. FIG. 9 makes the comparison easier with the prior art example of FIG. 6, being different therefrom in that the final stage delay element $D_{13}$, the multiplier $m_{14}$ related to the output thereof and the multiplicative coefficient $A_{14}$ are missing so that the number of output lines from the column of delay elements is odd. FIG. 10 results if input data and zero data are alternately inputted from FIG. 9 and multiplication regarding zero data is omitted. In FIG. 10, calculations are carried out in synchronization with the sampling frequency and multiplications are alternately done regarding odd-numbered coefficients ($A_1, A_3, A_5, A_7, A_9, A_{11}$ and $A_{13}$) and even-numbered coefficients ($A_2, A_4, A_6, A_8, A_{10}$ and $A_{12}$). Since the digital filter is linear-phased, the following relationships hold: $A_1=A_{13}$, $A_2=A_{12}$, $A_3=A_{11}$, $A_4=A_{10}$, $A_5=A_9$ and $A_6=A_8$. It is to be noted at this point that equalities hold always between two odd-numbered coefficients and between two even-numbered coefficients. This makes it possible to first add the pairs, each with matching timing for the execution of multiplication and having equal coefficients and then to carry out multiplications.

To explain the above more clearly, if the contents stored in the individual delay elements of FIG. 10 are $M_1 \ldots M_7$, the sum P of the products of odd-numbered coefficients is $$P=M_1A_1+M_2A_3+M_3A_5+M_4A_7+M_5A_9+M_6A_{11}+M_7A_{13}.$$

Since $A_1=A_{13}$, $A_3=A_{11}$ and $A_5=A_9$, we obtain $$P=(M_1+M_7)A_1+(M_2+M_6)A_3+(M_3+M_5)A_5+M_4A_7. \quad (1)$$

Similarly, the sum Q of the products of even-numbered coefficients is $$Q=M_1A_2+M_2A_4+M_3A_6+M_4A_8+M_5A_{10}+M_6A_{12}.$$

But since $A_2=A_{12}$, $A_4=A_{10}$ and $A_6=A_8$, we obtain $$Q=(M_1+M_6)A_2+(M_2+M_5)A_4+(M_3+M_4)A_6 \quad (2)$$

As can be understood by comparing (1) and (2), different terms are added in P and Q. According to the embodiment shown in FIG. 8, therefore, $M_1 \ldots M_4$ and $M_5 \ldots M_7$ are taken out in different timing by means of two-phase clock pulses $\phi_1$ and $\phi_2$.

Figure 11:
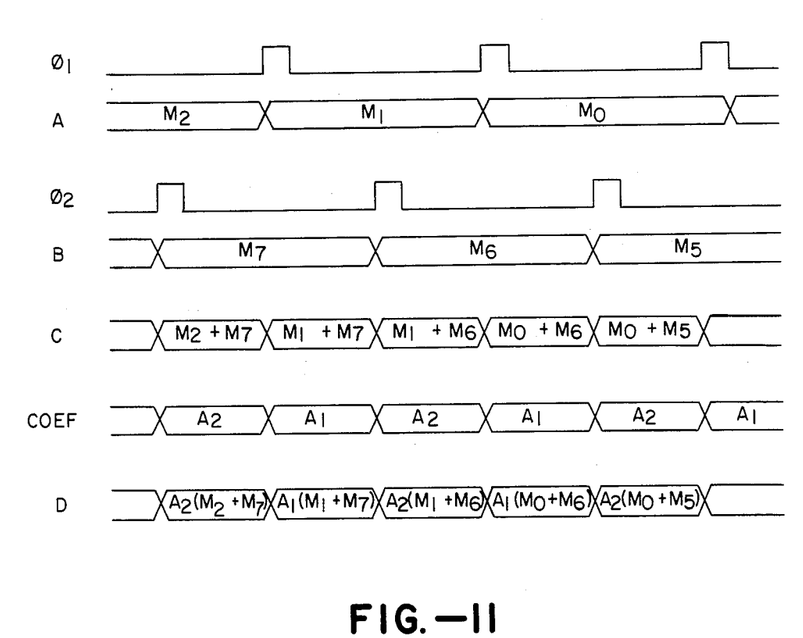
FIG. 11 is a time chart for explaining the operation according to the first embodiment.

FIG. 11 is a time chart for the part of the calculation relating to coefficients $A_1$ and $A_2$ with regard to FIG. 8. Input signal A to the adder $AD_1$ is sequentially taken out in the order of $\ldots M_2, M_1, M_0 \ldots$ in synchronization with clock signal $\phi_1$ while the other input signal B is taken out in the order of $\ldots M_7, M_6, M_5 \ldots$ in synchronization with clock signal $\phi_2$. Since the total output C from the adder $AD_1$ is $(A+B)$, output is made sequentially in the order $\ldots (M_2+M_7), (M_1+M_7), (M_1+M_6), (M_0+M_6), (M_0+M_5) \ldots$ and the multiplicative coefficients corresponding to them are inputted to the multiplier $m_1$, alternating between $A_1$ and $A_2$ in synchronization with the clock signals $\phi_1$ and $\phi_2$. As the result, the multiplier $m_1$ outputs alternately the first term of (1) and the first term of (2). Similar calculations are performed by the other multipliers $m_2$, $m_3$ and $m_4$ so that an equivalent of P+Q is obtained as the output from the last-stage adder AD.

Figure 12:
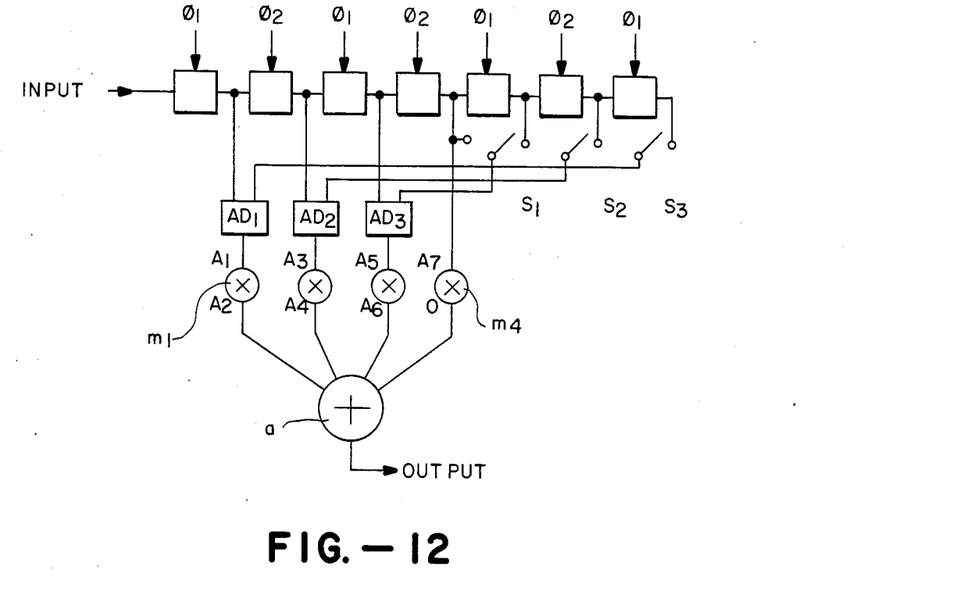
FIG. 12 is a circuit diagram according to a second embodiment.

There is shown in FIG. 12 a second embodiment of the present invention which is different from the aforementioned first embodiment in that the column of delay elements are shifted by a common clock signal $\phi_1$ and the input signals to the first-stage adders $AD_1 \ldots AD_3$ are switched by the switches $S_1$, $S_2$ and $S_3$ which are in synchronization with the timing for multiplication.

Figure 13:
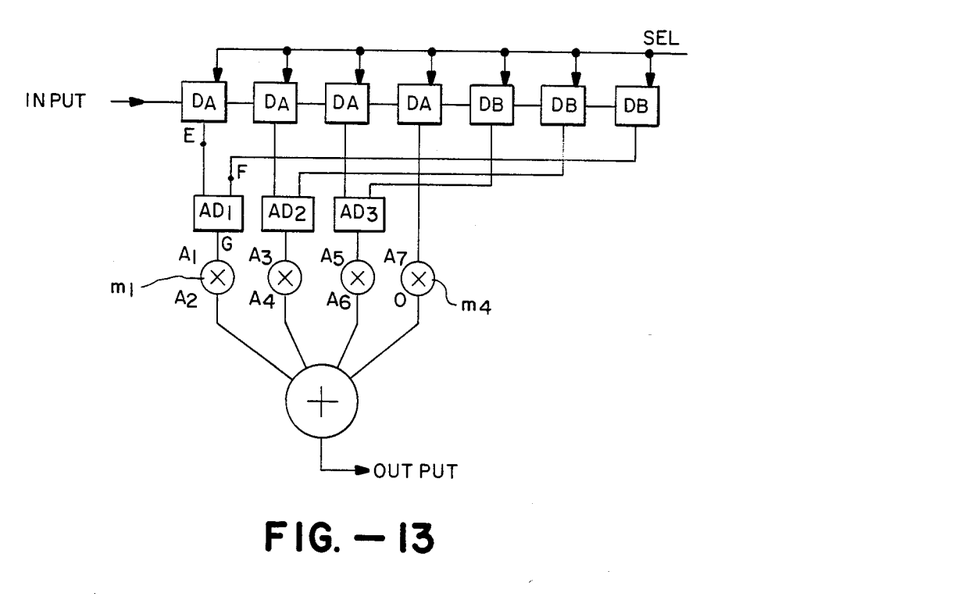
FIG. 13 is a circuit diagram according to a third embodiment.
Figure 14:
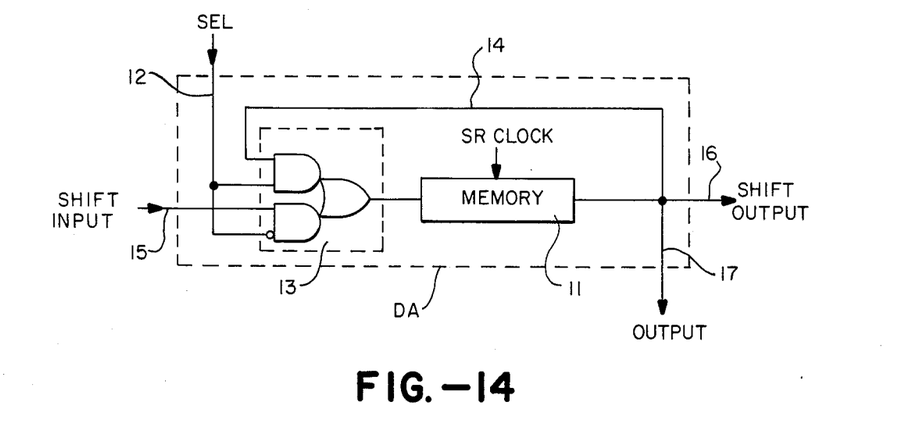
FIGS. 14 and 15 are circuit diagrams, respectively, for the delay elements DA and DB of FIG. 13.
Figure 15:
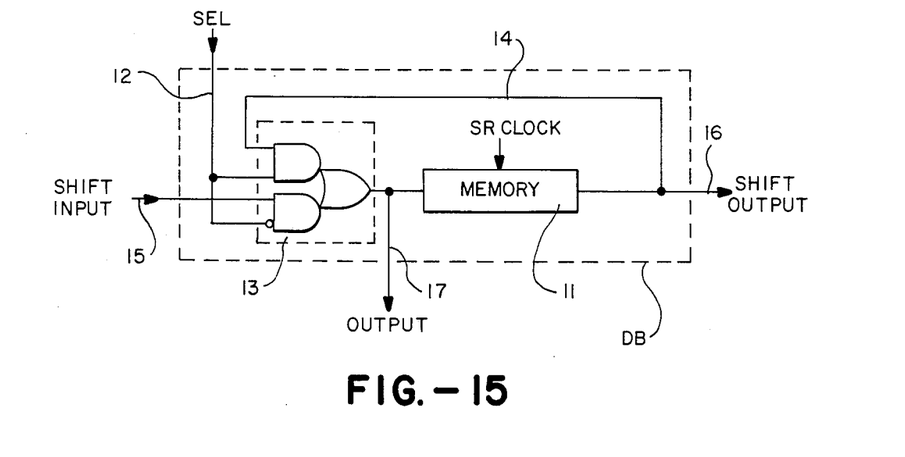

A third embodiment of the present invention is shown in FIG. 13, with the internal structures of the first and second delay elements DA and DB of FIG. 13 being respectively shown in FIGS. 14 and 15. Both the first and second delay elements DA and DB comprise a memory 11 having a predetermined delay time, a control input line 12, a gate circuit 13 for switching and a cycling circuit 14 so that the memory content can be both kept circulating and outputted serially if the control signal SEL is "1" and that the aforementioned cycling loop is cut off if SEL is "0", the shift input data from a shift input line 15 being introduced into the memory 11 and the data originally stored in the memory being shifted to the next stage through a shift output line 16. A data output line 17 to a first-stage adder leads from the output terminal of the memory 11 in the case of a first delay element DA and from the input terminal of the memory 11 in the case of a second delay element DB.

Figure 16:
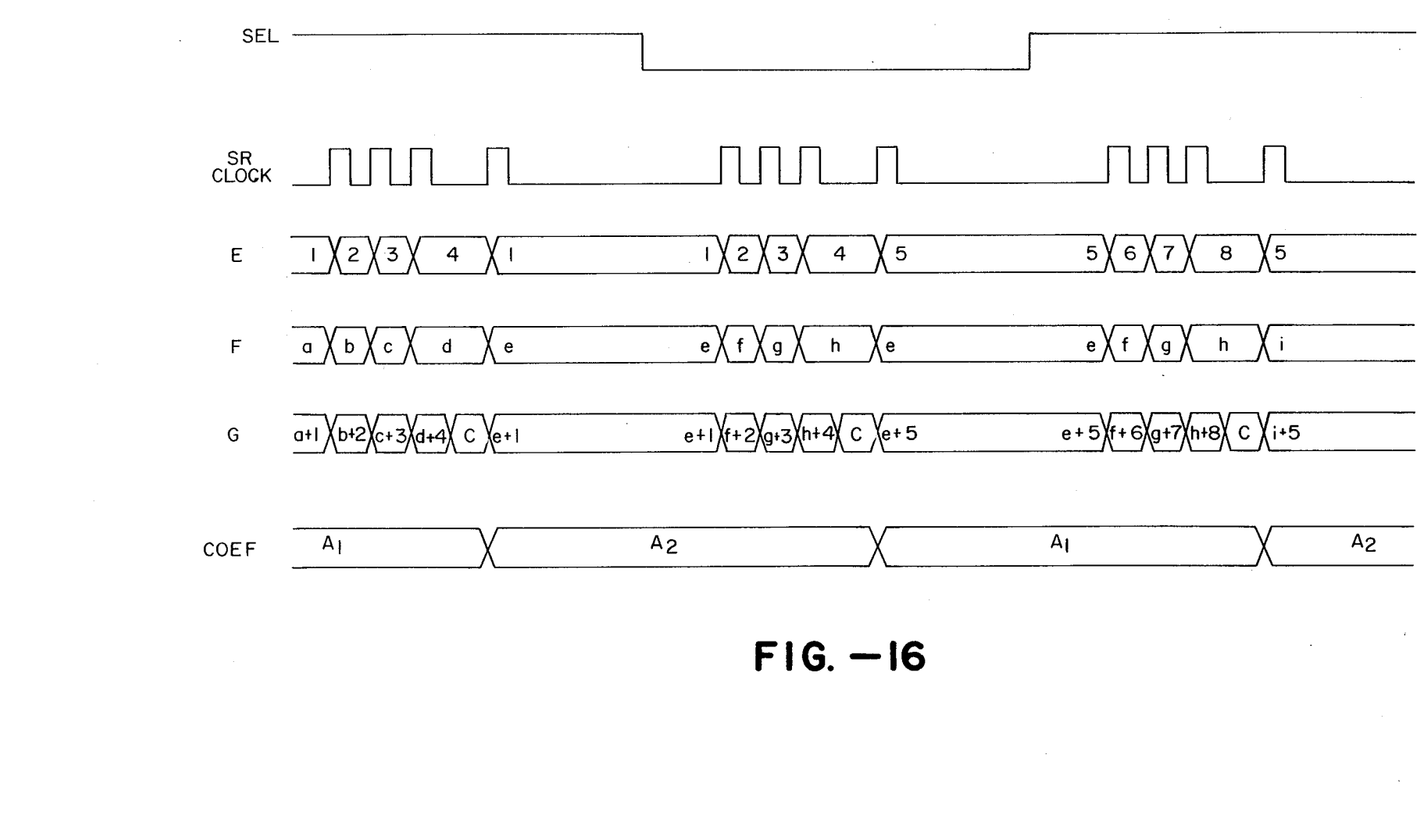
FIG. 16 is a time chart for explaining the operation according to the embodiment of FIG. 13.

FIG. 16 is a time chart for explaining the aforementioned third embodiment. In this example, data "1234" is first stored in the memory of a first delay element DA and is being outputted while SEL is "1". Next, SEL becomes "0" and a new data "5678" is shift-inputted, sending the original data "1234" out. when SEL becomes "1" again, data "5678" is both maintained in the memory and outputted at the same time. In the meantime, data "abcd" is similarly stored in the memory of a second delay element DB and is being outputted while SEL is "1". When SEL becomes "0" next, the new data "efgh" is shift-inputted, outputting the old data "abcd". When SEL becomes "1" again, data "efgh" is both maintained in the memory and being outputted at the same time. In this situation, the signals through the two input lines E and F into the first-stage adder $AD_1$, those through the output line G out of the adder $AD_1$ and the multiplicative coefficients $A_1$ and $A_2$ of the multiplier $m_1$ change as shown in FIG. 16. The same result of calculation can thus be obtained. This embodiment is convenient when data are serially processed.

Figure 17:
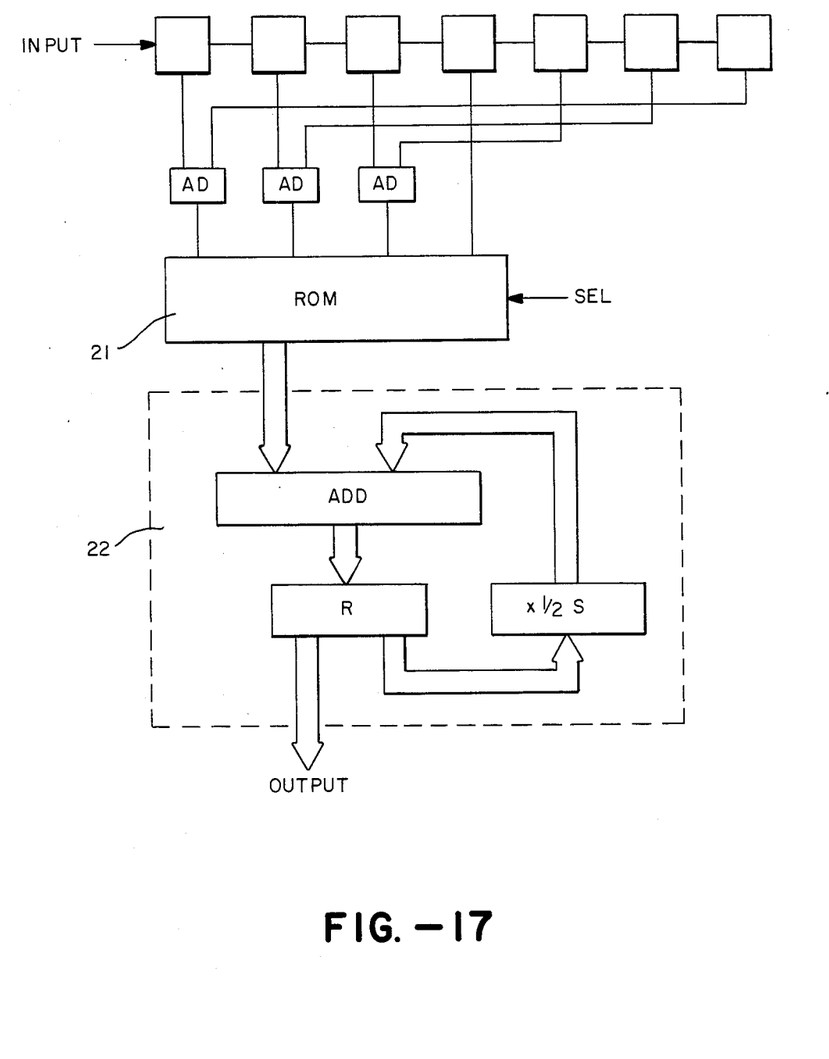
FIG. 17 is a circuit diagram according to a fourth embodiment of the present invention.

A fourth embodiment of the present invention is shown in FIG. 17. This results by omitting the plurality of multipliers $m_1 \ldots m_{14}$ and the adder a from the prior art design of FIG. 6 and by using a ROM 21 and an accumulator 22 instead according to a well-known method in this technology. All results of multiplications are stored in this ROM 21 so that when a ROM address is specified by a multiplier and a multiplicand, their product can be fetched immediately.

Figure 18:
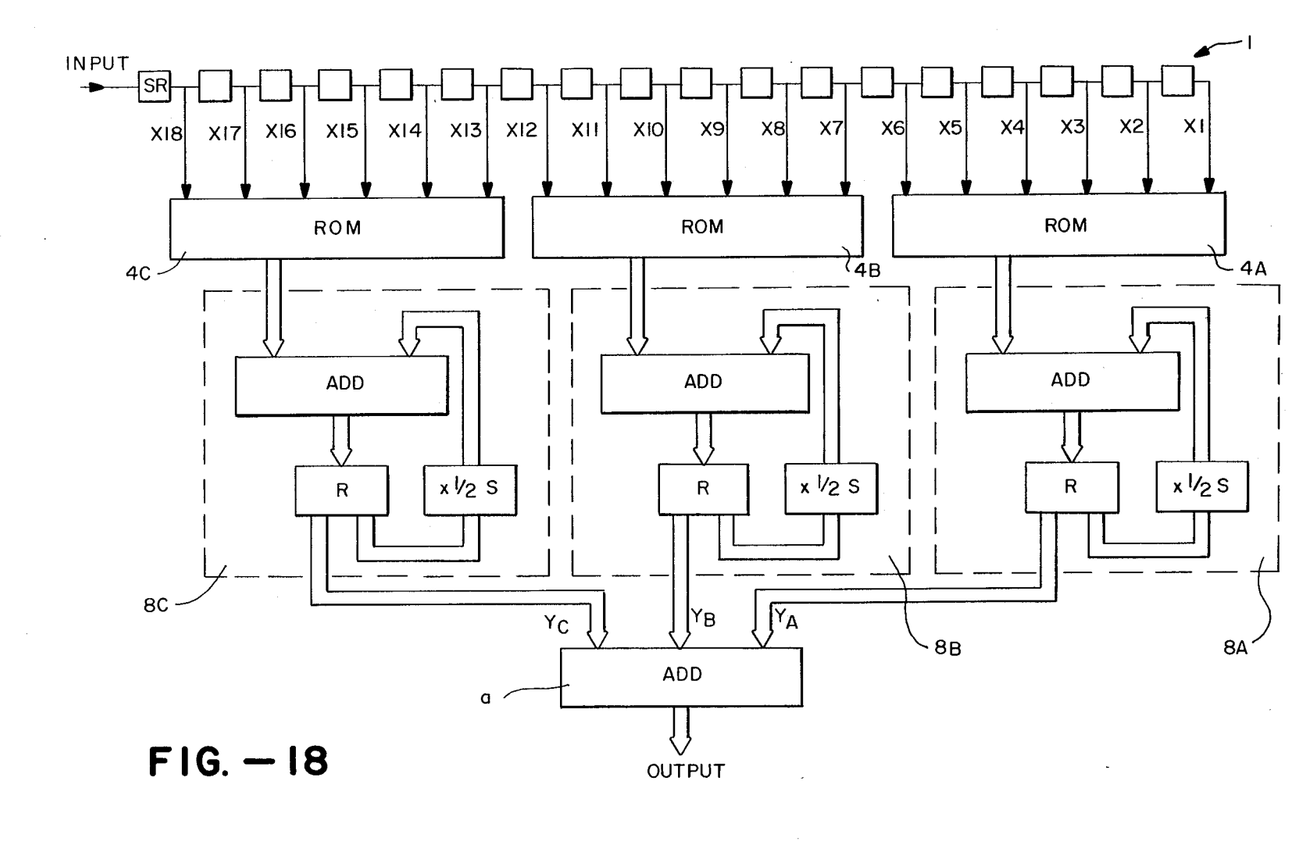
FIG. 18 is a circuit diagram according to a fifth embodiment of the present invention.

A fifth embodiment of the present invention is shown in FIG. 18 wherein the ROM of FIG. 17 is divided into three parts. Of the outputs $X_1 \ldots X_{18}$ from the 18 delay elements $SR_1 \ldots SR_{18}$, $X_1 \ldots X_6$ become the address of a first ROM 4A, $X_7 \ldots X_{12}$ that of a second ROM 4B and $X_{13} \ldots X_{18}$ that of a third ROM 4C. These segmented ROMs 4A, 4B and 4C are respectively provided with accumulators 8A, 8B and 8C, each of which comprises a parallel adder ADD, a register R and a shifter S. The outputs $Y_A$, $Y_B$ and $Y_C$ from the accumulators 8A, 8B and 8C are added by an adder 9 to yield an output Y.

The output $Y_A$ from accumulator 8A is $$Y_A = a_{13}X_6 + a_{14}X_5 + \ldots + a_{18}X_1 \quad (3)$$

but $X_n = \Sigma 2^j X_{n,j}$ where $n = 1, 2, \ldots 6$ and the summation is from $j=0$ to $N-1$ (j and N, respectively, representing the bit position of the data and the length of the data). Therefore, $$Y_A = \Sigma 2^j (a_{13}X_{6,j} + a_{14}X_{5,j} + \ldots + a_{17}X_{2,j} + a_{18}X_{1,j}) \quad (4)$$

Since $X_{n,j}$ ($n = 1, \ldots 6$ and $j = 0, \ldots N-1$) can be either "0" or "1" and the $\alpha$ are constants, the sum inside the parentheses of (4) can take only $2^6 = 64$ different values. This means that a capacity of 64 words is all that is required of ROM 4A. The same holds also for the other two ROMs. Thus, the total capacity required of the three ROMs 4A, 4B and 4C of FIG. 18 is $3 \times 64 = 192$ words.

Figure 19:
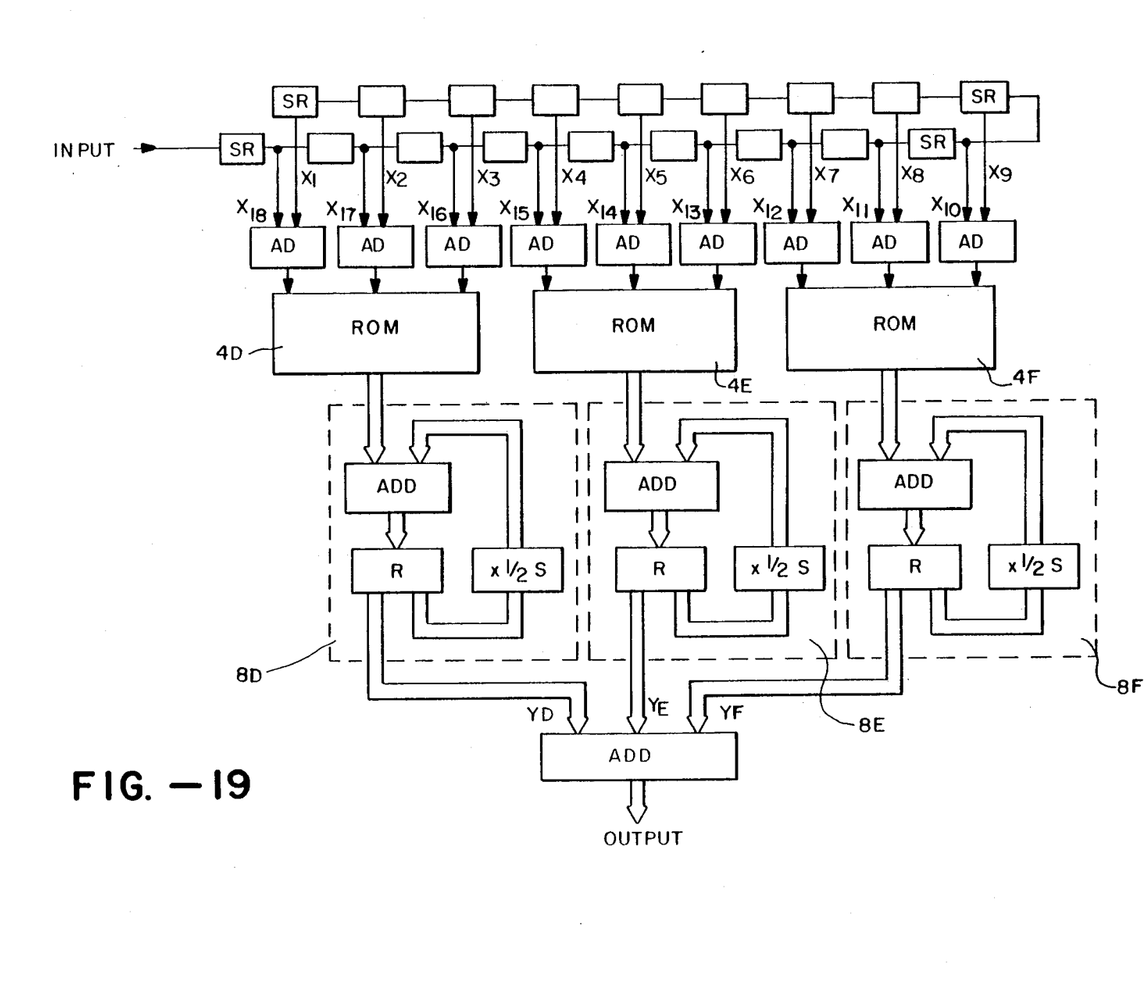
FIG. 19 is a circuit diagram according to a sixth embodiment of the present invention.

FIG. 19 discloses a sixth embodiment of the present invention according to which pairs of shift register outputs having same multiplicative coefficients such as $X_1$ and $X_{18}$, $X_2$ and $X_{17}$, $X_3$ and $X_{16}$, $X_4$ and $X_{15}$, $X_5$ and $X_{14}$, $X_6$ and $X_{13}$, $X_7$ and $X_{12}$, $X_8$ and $X_{11}$, and $X_9$ and $X_{10}$ are added first by first-stage adders $AD_1 \ldots AD_9$ and these sums become the addresses of the divided ROMs 4D, 4E and 4F. The circuit composition after the ROM output is the same as shown in FIG. 18.

The output $Y_D$ from the accumulator 8D which relates to ROM 4D is $$Y_D = a_7(X_{12} + X_7) + a_8(X_{11} + X_8) + a_9(X_{10} + X_9) \quad (5)$$

but $X_n = \Sigma 2^j X_{n,j}$ where $n = 7, \ldots 12$ and the summation is from $j = 0$ to $N-1$ (j and N having the same meaning as explained above). Therefore, $$Y_D = \Sigma 2^j [a_7(X_{12,j} + X_{7,j} + C_{j-1}) + a_8(X_{11,j} + X_{8,j} + C_{j-1}) + a_9(X_{10,j} + X_{9,j} + C_{j-1})] \quad (6)$$

where C is the carry of the serial adder. Since the expression inside each pair of parentheses in (6) is either "0" or "1" and the $\alpha$ are constants, the expression inside the bracket in (6) can take only $2^3 = 8$ different values. This means that a capacity of 8 words is all that is required of ROM 4D. Since the same holds also for the other two ROMs, the total capacity required of the three ROMs is $3 \times 8 = 24$ words.

This is to be compared with an address of $2^{18} = 262144$ words that would be required of a ROM according to the prior art design. This number is reduced to 192 by the present invention. If first-stage adders are provided, this can further be reduced to 24.

The present invention has been described above by a limited number of embodiments. The above description, however, should be considered as illustrative and not as limiting. For example, the number of serially connected delay elements may be varied and the ROM of FIG. 17 may be divided into a number of segments other than three. The scope of the present invention is limited only by the following claims.

What is claimed is:

1. In a linear-phase non-recursive digital filter comprising a shift register which receives an input signal at an input sampling frequency, said shift register having a specified number of serially connected delay elements having a specified delay time, and a plurality of calculating means for performing product summing operations on outputs from said delay elements to produce an output signal at an output sampling frequency which is twice said input sampling frequency, the improvement wherein said specified number is odd and greater than 1, and each of said calculating means includes a multiplier and a first-grade adder which transmits a sum signal to said multiplier.

2. The filter of claim 1 wherein said plurality of calculating means include first through $((N-1)/2)$th first stage adders and first through $((N+1)/2)$th multipliers where N is said specified odd number, the output lines from the ith and $(N+1-i)$th of said delay elements being connected to input terminals of the ith of said first-stage adders where i is a dummy index varying between 1 and $(N-1)/2$ inclusive, the ith of said first-stage adders being connected to the ith of said multipliers, the output line from the $((N+1)/2)$th of said delay elements being connected to the $((N+1)/2)$th of said multipliers.

3. The filter of claim 2 further comprising a final-stage adder connected to each of said multipliers.

4. In a digital filter comprising a serial shift register with serially connected delay elements with a specified delay time, output lines individually connected to said delay elements, read-only memory means to be addressed through said output lines, and adding means for performing adding operations on outputs from said ROM means, the improvement wherein said read-only memory means are divided into a plural N-number of segments and said adding means comprises N accumulators each for performing adding operations on outputs from one of said segments, there being a final-stage adder for adding outputs from said accumulators, and wherein each of said accumulators comprises a parallel adder with an input terminal connected to one of said segments and an output terminal, and a register with an input terminal connected to said output terminal of said parallel adder, said register having an output terminal connected to said final-stage adder and another output terminal connected to another input terminal of said parallel adder through a shifter.

5. The filter of claim 4 wherein said segments are sequentially numbered from 1 to N, said serial shift register having 2 nN delay elements which are sequentially numbered from 1 to 2 nN, n being an integer greater than 1, said filter further comprising nN first-stage adders sequentially numbered from 1 to nN, the jth of said first-stage adders having input terminals connected to the jth and the $(2nN+1-j)$th of said delay elements, j being a dummy index varying between 1 and nN inclusive.

6. The filter of claim 5 wherein the kth of said segments is connected to the $(k-1)n+1)$st through (kn)th parallel adders where k is an integer varying between 1 and N.

7. The filter of claim 4 wherein said segments are sequentially numbered from 1 to N, said serial shift registers having nN delay elements which are sequentially numbered from 1 to nN, n being an integer greater than 1, the jth of said segments being connected to the output lines from n of said delay elements from the $((j-1)n+1)$st through the (nj)th where j is a dummy index varying between 1 and N inclusive.

* * * * *